US012767527B2

(12) United States Patent
Hong et al.

(10) Patent No.: US 12,767,527 B2
(45) Date of Patent: Oct. 20, 2026

(54) ACTIVE MATRIX PROGRAMMABLE MIRROR

(71) Applicant: OBSIDIAN SENSORS, INC., San Diego, CA (US)

(72) Inventors: John Hong, San Diego, CA (US); Tallis Chang, San Diego, CA (US); Bing Wen, San Diego, CA (US); Edward Chan, San Diego, CA (US); Sean Andrews, San Diego, CA (US); Heesun Shin, San Diego, CA (US)

(73) Assignee: OBSIDIAN SENSORS, INC., San Diego, CA (US)

( * ) Notice: Subject to any disclaimer, the term of this patent is extended or adjusted under 35 U.S.C. 154(b) by 294 days.

(21) Appl. No.: 18/750,995

(22) Filed: Jun. 21, 2024

(65) Prior Publication Data

US 2024/0359974 A1 Oct. 31, 2024

Related U.S. Application Data

(63) Continuation-in-part of application No. 17/896,978, filed on Aug. 26, 2022, now Pat. No. 12,378,109, and a continuation-in-part of application No. 17/207,433, filed on Mar. 19, 2021, now Pat. No. 12,061,331.

(60) Provisional application No. 63/522,387, filed on Jun. 21, 2023, provisional application No. 63/237,496, filed on Aug. 26, 2021, provisional application No. 62/992,087, filed on Mar. 19, 2020.

(51) Int. Cl.

| | |
|---|---|
| ***B81C 1/00*** | (2006.01) |
| ***B81B 3/00*** | (2006.01) |
| ***G02B 26/00*** | (2006.01) |
| ***G02B 26/08*** | (2006.01) |

(52) U.S. Cl.

CPC ........ *B81C 1/00468* (2013.01); *B81B 3/0062* (2013.01); *B81C 1/00142* (2013.01); *B81C 1/00158* (2013.01); *B81C 1/00182* (2013.01); *B81C 1/00373* (2013.01); *B81C 1/00436* (2013.01); *B81C 1/00444* (2013.01); *B81C 1/00476* (2013.01); *B81C 1/00484* (2013.01); *B81C 1/00492* (2013.01); *G02B 26/00* (2013.01); *G02B 26/0833* (2013.01); *B81B 2201/042* (2013.01)

(58) Field of Classification Search

None

See application file for complete search history.

(56) References Cited

U.S. PATENT DOCUMENTS

| | | | | |
|---|---|---|---|---|
| 6,384,952 | B1 | 5/2002 | Clark et al. | |
| 2009/0289606 | A1 | 11/2009 | Lauxtermann et al. | |
| 2015/0277099 | A1 | 10/2015 | Hong et al. | |
| 2016/0103515 | A1 | 4/2016 | Seo et al. | |
| 2018/0304309 | A1* | 10/2018 | Tan | B32B 43/003 |

FOREIGN PATENT DOCUMENTS

| | | | | |
|---|---|---|---|---|
| CN | 108147360 | A | 6/2018 | |
| CN | 117945337 | * | 4/2024 | B81B 7/02 |

* cited by examiner

*Primary Examiner* — Jiong-Ping Lu

(74) *Attorney, Agent, or Firm* — Procopio, Cory, Hargreaves & Savitch LLP

(57) ABSTRACT

Membrane fabrication including: depositing a bottom Molybdenum (Mo) layer; depositing a polyimide (PI) layer and defining a first release hole; curing the PI layer; depositing a top Mo layer; and defining and etching a second release hole within the first release hole.

1 Claim, 3 Drawing Sheets

ACTIVE MATRIX PROGRAMMABLE MIRROR

CROSS-REFERENCE TO RELATED APPLICATIONS

This application is a continuation-in-part application of co-pending U.S. patent application Ser. No. 17/207,433 (filed Mar. 19, 2021) and co-pending U.S. patent application Ser. No. 17/896,978 (filed Aug. 26, 2022). This application also claims benefit of U.S. Provisional Application No. 63/522,387, filed Jun. 21, 2023. The entire disclosures of the above-referenced applications are incorporated herein by reference.

BACKGROUND

Field

The present disclosure relates to programmable mirrors, and more specifically, to mirror membrane fabrication process using Spin-on-Glass.

Background

A mirror membrane fabrication process associated with using a Spin-on-Glass (SoG) process may solve the mirror stress and nonuniform topography problem. However, the SoG process may lead to unacceptable results.

In some implementations, a deformable mirror places several requirements on the reflective surface, including tight specifications on the total surface flatness and minimization of any topography on the order of pixel-pitch (quilting). To satisfy these and other requirements, SoG may be a main membrane material. It may planarize the imprinted topography from the underlying microelectromechanical systems (MEMS) layers, and its natural tensile stress may pull the membrane taught if controlled properly. For example, the overall stress may be controlled to under 10 MPa by sequentially adding compressive plasma-enhanced chemical vapor deposition (PECVD) silicon oxide ($SiO_x$) layers between SoG depositions. However, the stress gradient may cause the membrane to not survive the release process.

SUMMARY

The present disclosure discloses a mirror membrane fabrication process.

In one implementation, a method of membrane fabrication disclosed. The method includes: depositing a bottom Molybdenum (Mo) layer; depositing a polyimide (PI) layer and defining a first release hole; curing the PI layer; depositing a top Mo layer; and defining and etching a second release hole within the first release hole.

Other features and advantages should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended drawings, in which like reference numerals refer to like parts, and in which.

DETAILED DESCRIPTION

As described above, a conventional mirror membrane fabrication process associated with using SoG may lead to unacceptable results including the stress gradient causing the membrane to not survive a release process.

Certain implementations of the present disclosure provide for using organic materials instead of inorganic materials to achieve both low stress and planarization. In some implementations, due to the high temperature stability and planarization achievable, polyimide (PI) is used as the organic component. In some implementations, the release process used by a fabrication process removes the organic components to leave behind inorganic components suspended above the substrate surface. Therefore, to incorporate any organic material designed to remain within the membrane after release, a multi-step encapsulation process may be used.

After reading the below descriptions, it will become apparent how to implement the disclosure in various implementations and applications. Although various implementations of the present disclosure will be described herein, it is understood that these implementations are presented by way of example only, and not limitation. As such, the detailed description of various implementations should not be construed to limit the scope or breadth of the present disclosure.

Figure 1A:
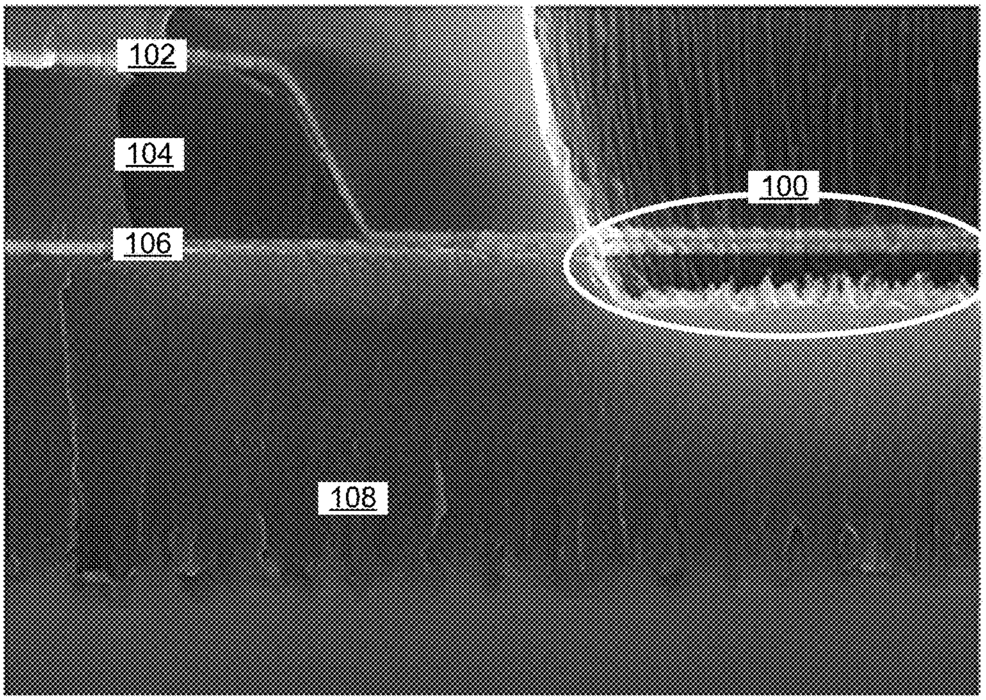
FIG. 1A is a cross-sectional scanning electron microscope (SEM) image of a polyimide (PI) membrane provided between two Molybdenum (Mo) layers showing an area of release holes through which the sacrificial organic material can leave.
Figure 1B:
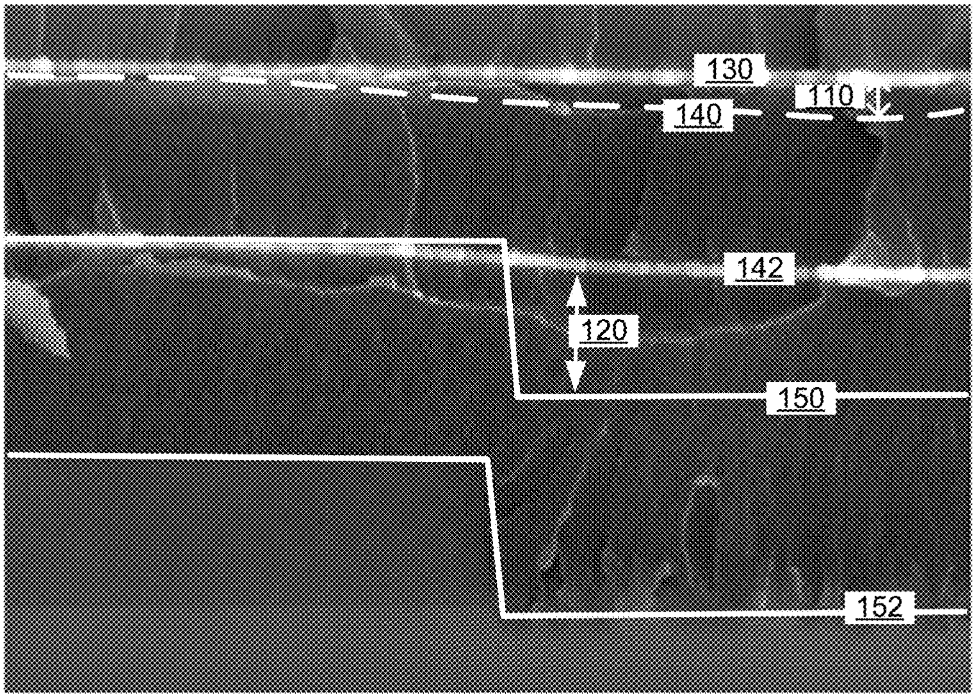
FIG. 1B is another cross-sectional SEM image of a PI membrane provided between two Mo layers showing additional planarization achieved by the PI membrane.

FIGS. 1A and 1B are cross-sectional scanning electron microscope (SEM) images of an exemplary PI membrane provided between two Molybdenum (Mo) layers.

FIG. 1A shows a SEM image of the area of release holes 100 through which the sacrificial organic material may leave. The SEM image of FIG. 1A shows a release hole 100, a top Mo layer 102, a PI membrane 104, a bottom Mo layer 106, and a sacrificial PI 108.

In the illustrated implementation of FIG. 1A, the SEM image shows a two-step lithography to encapsulate the exemplary PI within the membrane 104 to create holes through which the sacrificial organic material may leave (e.g., the release hole 100). Thus, FIG. 1A requires that the PI within the membrane 104 be completely encapsulated, so that it is not etched during the release process. Since release holes 100 are still needed to suspend the structure, steps of lithography are needed to protect the sidewalls.

In the illustrated implementation of FIG. 1A, the membrane structure is Mo/PI/Mo. A release hole 100 is defined within the PI layer with an intentionally shallow angle. This may allow the top Mo layer 102 to conformally coat the PI along the sidewall. Then a smaller release hole is patterned and etched through the Mo layers, allowing for sacrificial material underneath to be removed during the ashing process. The PI layer 104 within the membrane is the same material that is used as the sacrificial material, which means that the membrane PI needs to be protected during the removal of the sacrificial PI (i.e., the ashing process). This is accomplished by fully encasing the membrane PI with Mo metal. Thus, the release holes, which are necessary for removal of the sacrificial PI, are formed in such a way that the membrane PI is still fully encased. Therefore, Mo is deposited on the surface of the sacrificial PI to act as the bottom of the membrane. The membrane PI is deposited on the Mo metal. A hole of size X is patterned in the membrane PI but not the bottom Mo. The wall angle of that hole is shallow. Another Mo deposition occurs to cover the membrane PI and the hole. The shallow angle of the walls aids in the coverage of the membrane PI at the hole of size X. Another hole that only goes through the top and bottom Mo layers of size Y is patterned within the hole of size X, such that Y<X.

FIG. 1B shows additional planarization 110 achieved by the exemplary PI membrane. FIG. 1B shows line 130 which represents a top of the membrane 130 and line 142 which represents a bottom of the membrane 142. FIG. 1B also includes line 152 which represents the native topography of the substrate, and line 150 which represents the native topography of the substrate elevated to the bottom of the membrane to illustrate how much the sacrificial PI planarized the native topography of the substrate. Further, line 140 represents the native topography of the substrate elevated to the top of the membrane to illustrate how much the membrane PI planarized the remaining topography left over.

In FIG. 1B, the planarization 110 is from the PI membrane, while the planarization 120 is from the sacrificial material. The steps of a membrane fabrication process are as follows: (a) deposition of a bottom Mo layer; (b) spin, definition of a first release hole, and curing of a PI layer; (c) deposition of a top Mo layer; (d) definition and etch of a second release hole within the first release hole (basically a stacked via). This limits the effect size of the release hole to be approximately 6 μm, whereas the previous size may be approximately 2.5 μm. Positively, the PI within the membrane helps to further planarize the top membrane surface 130. The bottom of the membrane 142 is less planarized than the top, as the structure from the substrate topography is attempting to print through.

As can be seen from the image in FIG. 1B, the PI within the membrane may add an extra degree of planarization that the original sacrificial material may not be able to handle. In some implementations, the structure used is approximately 1 μm tall, which is larger than some implementations of topography on an integrated MEMS backplane.

Figure 2A:
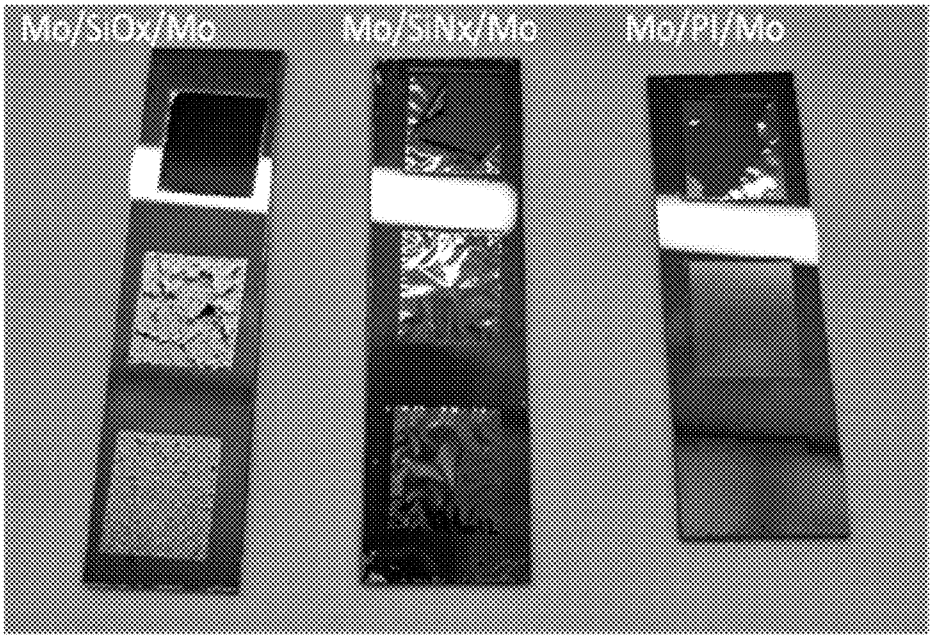
FIG. 2A shows a comparison between inorganic- and organic-based exemplary membranes after release.

FIG. 2A shows a comparison between inorganic- and organic-based exemplary membranes after release. Although all the films may experience some compressive shift, the membranes composed of PI remained globally and locally flat after release, such that it was not possible to tell if the structure was suspended without destructive interrogation. As shown in FIG. 2A, the membranes including silicon oxide ($SiO_x$) and silicon nitride (SiN) shifted to net compressive stress and buckled after release. However, the Mo/PI/Mo stack remains reflective and flat. Note that the top squares in each sample were purposefully removed for further analysis, and in the case of the PI membrane, to see if the membrane was suspended. The iridescence observed in the image is due to the high density of release holes used for these test structures, which is roughly 3× what is used in the integrated devices.

With these results, the PI was integrated on the deformable mirror (DM) backplane wafers, wherein the mirror size is approximately 33×33 mm, which is roughly 10 times the area of the test samples. Moreover, a slightly thinner PI within the membrane compared to the test samples (approximately 300 nm PI in the DM vs 1.5 μm PI in the test samples) was used. The rationale for this change was to make the membrane less stiff and thereby allow for a very tight influence function. Further, to prevent the effect of oxidation on the Mo layers encapsulating the PI within the membrane, $SiN_x$ was added on each side of the membrane to make the whole stack as follows: $SiN_x$/Mo/PI/Mo/$SiN_x$.

In some implementations, the inorganic films are not flat immediately after release, and in the case of the $SiO_x$ membrane, several portions of the membrane may be torn (left two strips in FIG. 2A). Conversely, in some implementations, the PI-membrane remains unchanged from before and after the release process. In some implementations, the sacrificial material was removed in response to the release process.

Figure 2B:
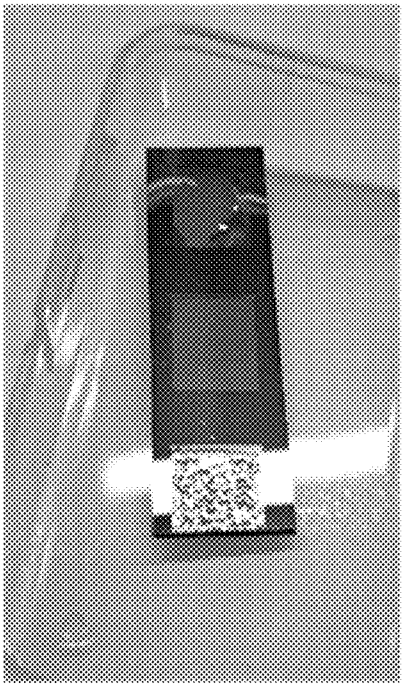
FIG. 2B shows the exemplary PI-based membrane remaining flat after three months.

In some implementations, the membrane is pierced (top square), and in response, the membrane comes off (e.g., proving the membrane was suspended). For example, FIG. 2B shows the exemplary PI-based membrane remaining flat after three months. Note that the bottom square may no longer be flat due to the edge having been scribed off, thus exposing the PI within the membrane to swell from moisture uptake from the air.

Figure 3:
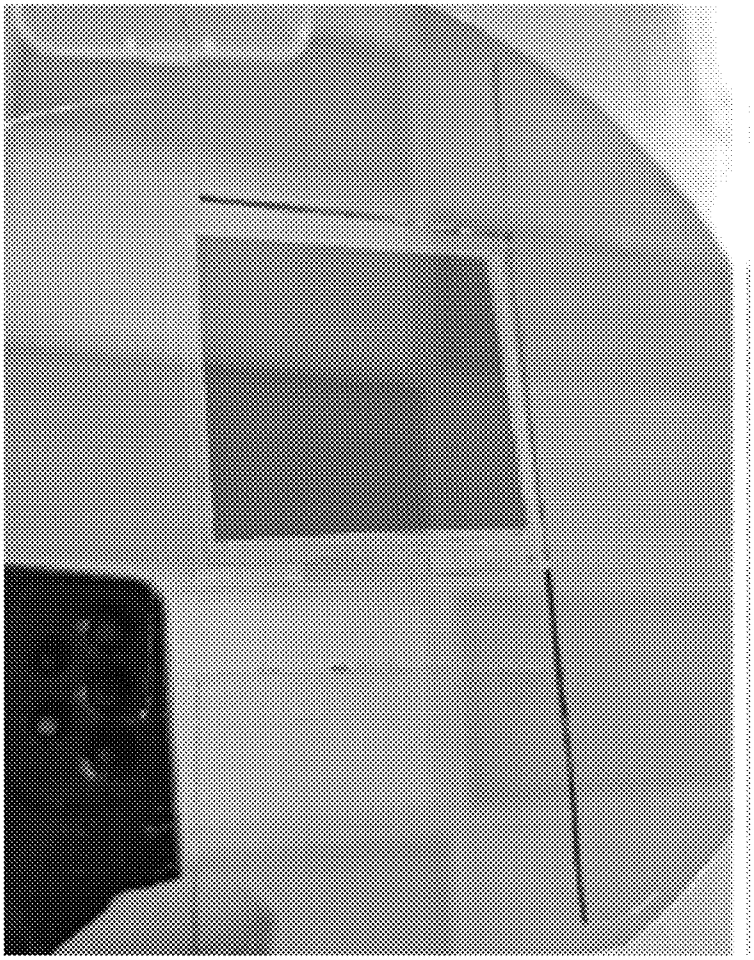
FIG. 3 shows an exemplary PI-based membrane integrated on a TFT backplane.

FIG. 3 shows an exemplary PI-based membrane integrated on a TFT backplane. In some instances, the membrane may wrinkle integration onto the backplane, which may be resolved. The disclosed flat membrane using the PI-based membrane may survive the release process and be electrostatically actuated by a programmable array of TFT switch circuitry on the backplane.

In summary, an organic (e.g., polyimide) based membrane is disclosed to advantageously reduce the stress, print-through, and survivability issues that may be associated with SoG. The disclosed PI-based membranes can survive the release process and maintain a flat suspended structure, advantageously allowing for integrating the deformable mirror onto the TFT backplane.

Those skilled in the art will recognize that the implementations described herein are representative, and deviations from the explicitly disclosed implementations are within the scope of the disclosure. For example, although the disclosed membrane is used for a mirror, it may be used for other MEMS, for example, in which tensile stress may need to be controlled. For example, the disclosed membrane may be used in fabricating MEMS sensor hinges (e.g., bolometer), a microphone membrane, or speaker membrane.

Although the disclosed implementations have been fully described with reference to the accompanying drawings, it is to be noted that various changes and modifications will become apparent to those skilled in the art. Such changes and modifications are to be understood as being included within the scope of the disclosed implementations as defined by the appended claims.

The terminology used in the description of the various described implementations herein is for the purpose of describing particular implementations only and is not intended to be limiting. As used in the description of the various described implementations and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," and/or "including," when used in this specification, specify the presence of stated features, integers, steps, operations, elements, and/or components, but do not preclude the presence or addition of one or more other features, integers, steps, operations, elements, components, and/or groups thereof. It will be further understood that the term "exemplary," when used in this specification, refers to serving as an example, instance, or illustration rather than to commendable or serving as a pattern.

All features of each of the above-discussed examples are not necessarily required in a particular implementation of the present disclosure. Further, it is to be understood that the description and drawings presented herein are representative of the subject matter which is broadly contemplated by the present disclosure. It is further understood that the scope of the present disclosure fully encompasses other implementations that may become obvious to those skilled in the art and that the scope of the present disclosure is accordingly limited by nothing other than the appended claims.

The invention claimed is:

1. A method for membrane fabrication, the method comprising:

depositing a bottom Molybdenum (Mo) layer;

depositing a polyimide (PI) layer and defining a first release hole;

curing the PI layer;

depositing a top Mo layer; and defining and etching a second release hole within the first release hole.

* * * * *